United States Patent
Lynch et al.

(10) Patent No.: US 10,574,201 B2
(45) Date of Patent: Feb. 25, 2020

(54) DYNAMIC TIME-WEIGHTED SYSTEMS AND METHODS FOR MANAGEMENT OF ACOUSTIC EXPOSURE

(71) Applicant: AVAYA INC., Santa Clara, CA (US)

(72) Inventors: John C. Lynch, Belleville (CA); Miguel Dearaujo, Belleville (CA)

(73) Assignee: Avaya Inc., Santa Clara, CA (US)

( * ) Notice: Subject to any disclaimer, the term of this patent is extended or adjusted under 35 U.S.C. 154(b) by 0 days.

(21) Appl. No.: 15/602,284

(22) Filed: May 23, 2017

(65) Prior Publication Data
US 2018/0343529 A1    Nov. 29, 2018

(51) Int. Cl.
| | | |
|---|---|---|
| H04R 29/00 | (2006.01) |
| H03G 3/30 | (2006.01) |
| H04R 3/00 | (2006.01) |
| H04R 5/04 | (2006.01) |
| H04R 5/033 | (2006.01) |
| H04R 1/10 | (2006.01) |

(52) U.S. Cl.
CPC ............ *H03G 3/3005* (2013.01); *H04R 3/00* (2013.01); *H04R 1/1008* (2013.01); *H04R 1/1083* (2013.01); *H04R 3/007* (2013.01); *H04R 5/033* (2013.01); *H04R 5/04* (2013.01); *H04R 2430/01* (2013.01)

(58) Field of Classification Search
CPC .............................. H04R 29/00; H04R 29/001
See application file for complete search history.

(56) References Cited

U.S. PATENT DOCUMENTS

| | | | | |
|---|---|---|---|---|
| 5,046,101 A | * | 9/1991 | Lovejoy | H03G 3/32 381/108 |
| 2012/0014553 A1 | * | 1/2012 | Bonanno | H03G 3/341 381/364 |

* cited by examiner

*Primary Examiner* — Mark Fischer
(74) *Attorney, Agent, or Firm* — Sheridan Ross P.C.

(57) ABSTRACT

Workplace safety is a principal concern in many environments. Protecting user ears from damage due to extended exposure to unacceptably high sound volume serves as an important component to workplace safety. Monitoring a device, such as a phone, utilized by a user often provides an incomplete picture of the sound level presented to the user. As provided herein, monitoring a user's sound exposure on one device may cause the sound level presented to the user from a second device to become limited. Additionally, over time the sound level limits may be adjusted based on the cumulative historic sound exposure. As a result, the user may avoid exposure to unacceptably high sound levels originating from more than one source and/or over an extended period of time.

20 Claims, 5 Drawing Sheets

DYNAMIC TIME-WEIGHTED SYSTEMS AND METHODS FOR MANAGEMENT OF ACOUSTIC EXPOSURE

COPYRIGHT NOTICE

A portion of the disclosure of this patent document contains material that is subject to copyright protection. The copyright owner has not objected to the facsimile reproduction by anyone of the patent document or the patent disclosure as it appears in the Patent and Trademark Office patent files or records, but otherwise reserves all copyright rights whatsoever.

FIELD OF THE DISCLOSURE

The invention relates generally to systems and methods for audio output devices and more particularly to control systems associated with energy output of such devices.

BACKGROUND

Global workplace safety standards are defining limits on the acoustic levels workers can be exposed to. These limits include short term levels and long term levels. For short periods, higher levels are allowed. For longer periods, from a fraction of an hour to a full work shift and up to a full day, the average sound pressure has a limit inversely proportional to the averaging time.

These national standards for acoustic limits are not limited to a single source such a communication device, but are the sum of all sources workers are exposed to over the course of the averaging time. Governmental and other agencies often provide information exposure limits for sound levels (see, FIGS. 1A-1B).

SUMMARY

These and other needs are addressed by the various embodiments and configurations of the present invention. The present invention can provide a number of advantages depending on the particular configuration.

The communication device acoustic limiter dynamically adjusts peak output levels based on the sum of the workplace environment and the ongoing communication needs of each user to meet safety standards as well as deliver the best communication performance. These and other advantages will be apparent from the disclosure of the invention(s) contained herein.

Prior art headset solutions are expensive and excessively restrictive because they do not adjust for talk time on a phone but, instead, set the level assuming the user is spending the entirety of their work day in a listening mode (i.e., listening to output from the speaker portion of the headset). Prior art solutions in headsets may monitor their own audio energy output but are oblivious to the environmental noise that contributes to a user's overall exposure and may cause a user to be overexposed. Similarly, a user may utilize other audio devices different from a sound-limiting headset, such as an aggregate of headsets, earbud, handsfree and/or handset providing multiple sources of acoustic the exposure. Additionally, prior art solutions provide static limits which over compress the acoustic energy and reduce the loudness, which may significantly affect the sound quality by reducing the audio's dynamic range.

Many users spend a significant portion of their work shift engaged in communications via an electronic communication device, such as telephones, two-way radios, wired intercoms, etc. While the embodiments provided herein utilize the telephone, or "phone," to serve as an example, it should be appreciated that non-phone audio devices providing audio output to a user's may be utilized in addition to, or alternately to, a phone. In another embodiment, the electronic communication device may be configured as audio output only devices and be absent or disabled any audio input component, such as a transcription headset. It should be appreciated that certain embodiments disclosed herein may benefit from or require a microphone or other audio input component and therefore be limited to embodiments of the electronic communication devices that comprise, or are configured to utilize, a microphone or other audio input component and/or audio input data. Audio data, as used herein, is the soundwave energy levels, typically measured in Decibels ("dB") and an associated duration of one or more levels.

The audio data provides a representation (e.g., numeric value, sum of values, aggregation of values, etc.) of sound energy as may be presented to an ear and/or ear drum and its duration. Generally, the embodiments herein are directed to identifying and mitigating damaging or potentially damaging sound levels to an ear. The sound energy presented to an ear may be measured at the ear or a distance from the ear with a known equivalence applied. For example, a sound level may be observed at a distance from the ear and a mathematical equivalence applied to the observed value for use as the sound level at the ear. Additionally, while the embodiments herein are generally directed towards sound energy observed and managed within the entirety of human-perceivable sound frequency spectrum, in other embodiments, a subset of such frequencies, different frequencies, and/or the selection of frequencies applicable to a non-human subject may be utilized without departing from the scope of the embodiments described herein.

With a phone (e.g., desk phone, soft phone, mobile, etc.), the sound pressure the user is exposed to can be determined indirectly, such as by monitoring output levels on the receive path of the phone. Additionally, attached or connected microphones may receive ambient sound levels, which may be monitored as an additional source of data used to determine the user's sound energy exposure. In one embodiment, the phone comprises circuitry and/or software configured circuitry to observe and process a user's exposure to ambient and device audio levels and may then calculate the complete user sound exposure.

In one embodiment, the cumulative level and duration of a user's audio level exposure is monitor during the time the user is active on a call.

In another embodiment, in addition to the first embodiment, active time that energy is determined to be above a threshold can be used as a more accurate timer of the user's exposure to sound energy. For example, exposure that is below a particular threshold, even on active calls, would be omitted from further considerations, such as a calculation to determine whether to reduce audio in output limits. For example, time a user spends being exposed to sound below 70 dB may be omitted from further processing as such levels of sound are known to have no detrimental effect on normal human ears. However, in other embodiments, all sound exposure data is utilized for processing.

In another embodiment, an audio power limitation is determined as the sum outputs of a single device having multiple audio outputs (e.g., handset, headset, earbud, handsfree, etc.) or their respective audio output component (e.g., speaker, transducer, etc.). Based on the summation of output levels for the multiple audio outputs, safety limits may be applied to the single device and thereby affect the output of device as a whole, and not to a single audio interface.

In another embodiment, in addition to monitoring the audio levels for calls, additional sources are monitored such as web conferences, YouTube, music, etc.

In another embodiment, time monitored acoustic safety measurements, when determined to be above a threshold (e.g., warning threshold, over the limit threshold, etc.) may then be used to trigger local and/or remote alerts. The alerts may inform the user and/or other party (e.g., supervisor, workplace safety personnel, automated agents, etc.) that the device and potentially the employee is, or is approaching, an over-the-limit acoustic exposure threshold and corrective action is or may become required.

In another embodiment, the audio output levels as presented to a user are monitored for a plurality of discrete devices. Upon determining a sum of the users exposure requires corrective action, the audio output of one or more devices may be reduced as needed. The device having the audio output reduced may or may not have contributed to the prior audio exposure of the user. For example, if user is active on a desk phone for a long period and the monitor has put some limit in place based on an exposure beyond a threshold due to the desk phone, then as the user moves to cell phone or other device this limit is applied to the new device. In another example, the audio limit is applied to the desk phone upon the user's continuation with, or return to, the desk phone.

In another embodiment, a limit may be determined based on a generic (e.g., standardized, government entity provided, etc.) standard for sound exposure. In a further embodiment, a specific limitation may be utilized to modify or instead of a generic standard. For example, a user with a known or suspected need for lower than average sound exposure may utilize a lower threshold of exposure in embodiments where a threshold is utilized, such as to limit the output of a device(s) and/or trigger an alert. In another embodiment, known or suspected ambient noise levels may be provided as inputs to the monitored audio levels. For example, two users have similar patterns of use of a phone. However, one user is in an environment that is noisier than a second user. Accordingly, the monitored level of audio devices may be supplemented by ambient noise levels as measured by a built-in microphone of one or more of the devices or as previously determined, such as to cause the one user to reach their threshold sooner as compared to the second user.

While monitoring a signal associated with an audio output (e.g., monitoring analog electrical signal voltage on a line known to correlate to an audio output, monitor digital encoding of volume on a line, etc.), in another embodiment, indirect measurement may be utilized to obtain certain audio level information. For example, a microphone on a speakerphone may measure volume while a user is using a headset.

In one embodiment, a system is disclosed, comprising: a processor to input, process, and output electrical signals; a first audio output for outputting sound; a second audio output for outputting sound at a level controllable, at least in part, by the processor; wherein, the processor, upon receiving a first audio level data from the first audio output, determines whether the first audio level data is above a threshold audio level data; and wherein, the processor, upon determining the first audio level data is above the threshold audio level data, executes an audio limiting action to cause the second audio output to operate at a reduced level audio output level.

In another embodiment, a system is disclosed, comprising: a processor to input, process, and output electrical signals; a first audio output for outputting sound at a level controllable, at least in part, by the processor; a second audio output for outputting sound at a level controllable, at least in part, by the processor; wherein, the processor, upon receiving a first audio level data from the first audio output and a second audio level data from the second audio output, determines whether the combination of the first audio level data and the second audio level data is above a threshold audio level data; and wherein, the processor, upon determining the combination is above the threshold audio level data, executes an audio limiting action to cause at least one of the first audio output or the second audio output to operate at a reduced audio output level.

In another embodiment, a method is disclosed, comprising: receiving, at a processor configured to input, process, and output electrical signals, a first audio level data from a first audio output; accessing, by the processor via a network interface, a threshold audio level data; determining, by the processor, whether the first audio level data is above the threshold audio level data; and upon determining the first audio level data is above the threshold audio level data, executing, by the processor, executing an audio limiting action to cause a second audio output to operate at a reduced audio output level.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be utilized to cause a machine (e.g., computer processor) to perform operations. The computer-readable storage medium may comprise, for example, but not be limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

The term "means" as used herein shall be given its broadest possible interpretation in accordance with 35 U.S.C., Section 112(f) and/or Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary, brief description of the drawings, detailed description, abstract, and claims themselves.

The preceding is a simplified summary of the invention to provide an understanding of some aspects of the invention. This summary is neither an extensive nor exhaustive overview of the invention and its various embodiments. It is intended neither to identify key or critical elements of the invention nor to delineate the scope of the invention but to present selected concepts of the invention in a simplified form as an introduction to the more detailed description presented below. As will be appreciated, other embodiments of the invention are possible utilizing, alone or in combination, one or more of the features set forth above or described in detail below. Also, while the disclosure is presented in terms of exemplary embodiments, it should be appreciated that an individual aspect of the disclosure can be separately claimed.

BRIEF DESCRIPTION OF THE DRAWINGS

The present disclosure is described in conjunction with the appended figures.

DETAILED DESCRIPTION

The ensuing description provides embodiments only and is not intended to limit the scope, applicability, or configuration of the claims. Rather, the ensuing description will provide those skilled in the art with an enabling description for implementing the embodiments. It will be understood that various changes may be made in the function and arrangement of elements without departing from the spirit and scope of the appended claims.

Any reference in the description comprising an element number, without a subelement identifier when a subelement identifier exists in the figures, when used in the plural, is intended to reference any two or more elements with a like element number. When such a reference is made in the singular form, it is intended to reference one of the elements with the like element number without limitation to a specific one of the elements. Any explicit usage herein to the contrary or providing further qualification or identification shall take precedence.

The exemplary systems and methods of this disclosure will also be described in relation to analysis software, modules, and associated analysis hardware. However, to avoid unnecessarily obscuring the present disclosure, the following description omits well-known structures, components, and devices that may be shown in block diagram form, and are well known or are otherwise summarized.

For purposes of explanation, numerous details are set forth in order to provide a thorough understanding of the present disclosure. It should be appreciated, however, that the present disclosure may be practiced in a variety of ways beyond the specific details set forth herein.

The terms "audio output level" and "volume" are used interchangeably to refer to the amplitude of sound produced or to be produced when applied to a sound producing device.

Figure 1A:
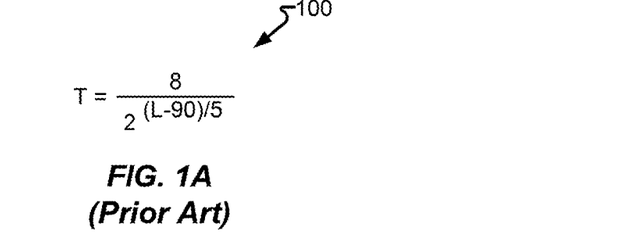
FIGS. 1A-1B depict a threshold sound limit formula and select data in accordance with the prior art.
Figure 1B:
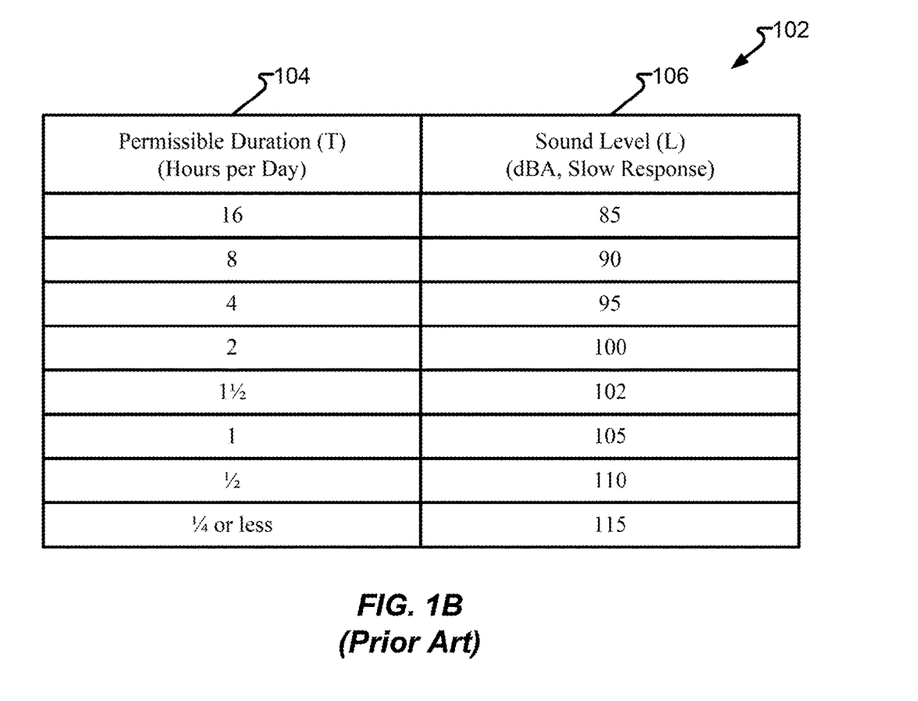

FIGS. 1A-1B depict a threshold sound limit formula and select data in accordance with the prior art. Embodiments disclosed herein may utilize an audio threshold which may be determined by another party, such as a governmental agency, insurance company, safety personnel, etc. The threshold may be determined formulaically, such as with formula 100 or via utilization of tabular data, such as provided by table 102 identifying certain durations of time 104 and associated sound levels 106 of FIG. 2B. It should be appreciated by those of ordinary skill in the art that other sources of threshold audio level data may be utilized without departing from the scope of the embodiments provided herein. The particular threshold limits illustrated in FIGS. 1A-1B are cumulative. For example, two hours exposure at 95 dB would represent half of the permissible duration for a day. An additional exposure of five hours at 90 dB would be over half (5/8 ths) of the permission able duration for a day. The two exposures combined would be over the daily permissible duration. However, in other thresholds of audio levels, specific sound levels may not be cumulative, reset partially or entirely with certain rest periods (e.g., a period of time spent with a reduced exposure to sound), etc. Continuing the previous example, but with the preceding alternative threshold methodology, as neither of the two exposures are individually over a single limit, a user so exposed would not be over a threshold limit. In another embodiment, the threshold may be static over time, however, in other embodiments, the threshold may be dynamic and changed during a work shift, day, week, or other timeframe. For example, high sound levels early in a work day may be subject to one threshold value but, after a period of time with reduced sound, allow a higher threshold to be utilized for the remainder of the work day.

Figure 2:
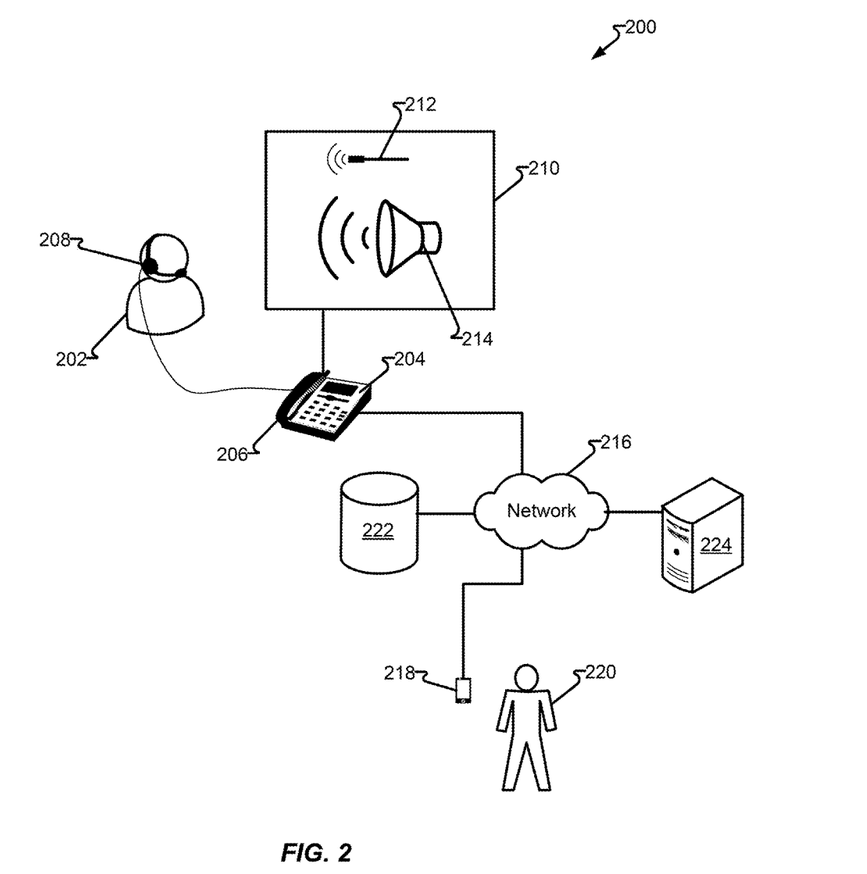
FIG. 2 depicts a first system in accordance with embodiments of the present disclosure.

FIG. 2 depicts system 200 in accordance with embodiments of the present disclosure. In one embodiment, user 202 receives audio from a source having a plurality of audio producing components. The device may be a telephone, such as phone 204 described below, or in other embodiments, any other audio-producing/controlling device, such as a computer, cellular telephone, radio, stereo, etc.

In one embodiment, user 202 receives audio from a plurality of interface components associated with a single device, telephone 204, including but not limited to, handset 206, headset 208, and/or speakerphone 210, which comprise speaker 214 and optionally microphone 212. Speakerphone 210 may be integrated with telephone 204 or connected via wired or wireless connection. Telephone 204 may be utilized by user 202 to communicate with customer 220 via customer communication device 218 (e.g., telephone, soft phone, cellular telephone, etc.). Telephone 204 may communicate with customer communication device 220 via network 216 which may comprise one or more of plain old telephone system (POTS), Internet, Intranet, private branch exchange (PBX), cellular network, and/or other communications network operable to convey audio or an audio portion of an audio-visual communication.

Prior art circuitry may be utilized to protect a user's hearing, and optionally sensitive electronic components, from a sudden excessive noise, such as a static "pop" having a duration of a fraction of a second or to limit the output such that no sound is above a particular level.

Many of the embodiments disclosed herein are directed towards the accumulation of sound levels from a plurality of sources that, when aggregated, have the potential to cause damage or at least be above a threshold, such as to produce audio levels above the one or more threshold audio levels defined by FIGS. 1A-1B. A limitation of the prior art circuitry to constrain excessive sound is that the circuitry is unaware of long-term excessive exposure and/or exposure from other sources of sound that, when aggregated, may be excessive and/or require an audio limiting action. Therefore, modifying sound-limiting circuitry to account for levels of a greater period of exposure sound alone may be, absent embodiments provided herein, insufficient to protect a user from multiple sources of sound.

In one example, user 202 utilizes headset 208 for four hours of a work shift, takes a break, and then utilizes speakerphone 210 for another four hours. Circuitry associated with headset 208 may report a below-threshold usage, as does circuitry associated with speakerphone 210. However, in another embodiment, device circuitry, such as within telephone 204 measures the sound level from both headset 208 and for speakerphone 210 and, if the aggregate is over a threshold audio level amount, performs a sound limiting action. In another embodiment, device circuitry receives sound level data from each of headset 208 and speakerphone 210. It should be appreciated that the location of the circuitry may be located elsewhere in other embodiments.

In another embodiment, one or more of the sound producing components (e.g., headset 208, handset 206, speakerphone 210, etc.) reports sound data (e.g., one or more of sound levels, duration, recordings, recording samplings, etc.) to database 222 accessible either directly to telephone 204 and/or via network 216. Circuitry may then access database 222 and one or more records therein to obtain sound level exposure data for the plurality of sound producing components and, if over the threshold audio level, execute the sound limiting action. In a further embodiment, database 222 may be accessed by circuitry embodied by server 224 to determine if the aggregate sound exposure is over a threshold audio level and execute the sound limiting action accordingly. It should be appreciated that other architectures may be utilized without departing from the scope of the disclosure provided herein.

Figure 3:
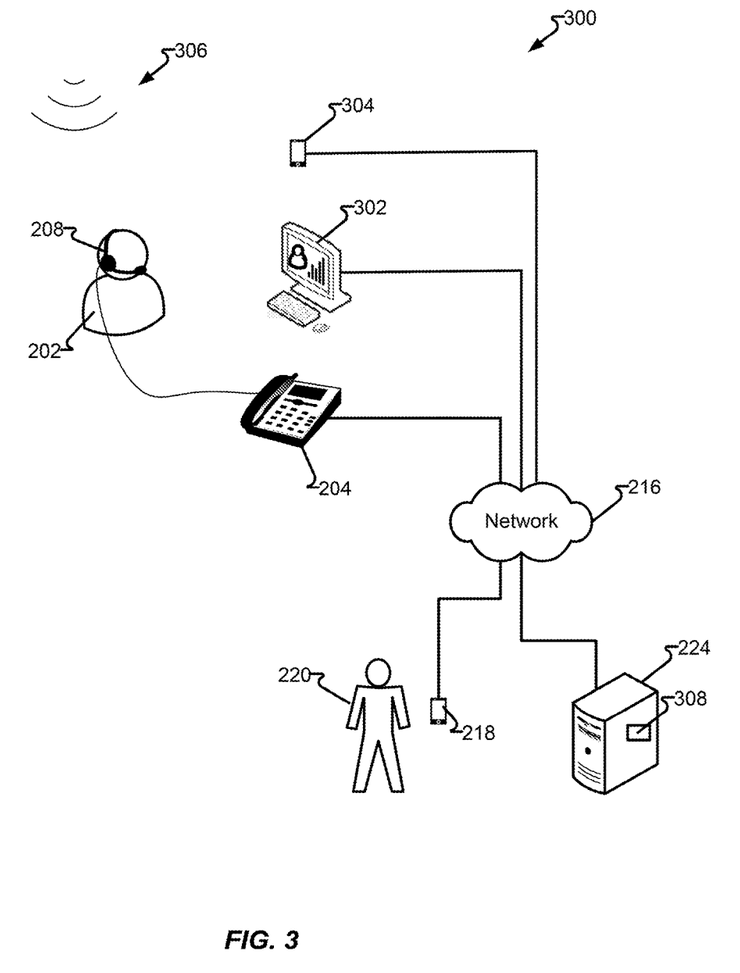
FIG. 3 depicts a second system in accordance with embodiments of the present disclosure.

FIG. 3 depicts system 300 in accordance with embodiments of the present disclosure. In one embodiment, user 202 receives sound from at least two sources. In one embodiment, the source is a single device with at least two outputs. For example, headphones 208 may comprise a left and right speaker, feed by signals on each of a first and second channel and provide stereo sound to user 202. Accordingly, in the embodiment, by monitoring one channel of the stereo sound the volume of the second channel may be modified by an audio limiting action.

In another embodiment, the monitored channel is unaffected by the audio limiting action. In a further embodiment, a processor may be provided that may affect the non-monitored channel, while the processor performs no action to affect the monitored channel. This embodiment will be explained in more detail with respect to certain embodiments that follow.

System 300 provides a plurality of audio sources to user 202. Sources may include, but are not limited to, phone 204 alone or with headset 208, such as to engage in a communication with user 220 utilizing customer communication device 218 via network 216. Computer 302 which may be used for audio and/or audio-visual communications, cellular telephone 304, and ambient noise source 306. Ambient noise source 306 may be electromechanical (e.g., speaker of a television and/or radio, music player, operation of equipment/machinery, etc.), organic (e.g., other people talking, dog barking, etc.), combinations (e.g., traffic) and/or other source of noise. Ambient noise source 306 contributes a portion of the sound exposure provided to user 202, however, processor 308 omits any audio limiting signal to the ambient noise source 306, such as when ambient noise source 306 cannot be regulated by processor 308 (e.g., equipment that is not configured to be affected by any signal from processor 308). However, processor 308 is configured to affect the audio output of certain other devices.

In another embodiment, processor 308 (i.e., an electrical machine as described more completely below), is able to control the audio output of a subset of sound producing components (e.g., headset 208, phone 204, computer 302, cellular telephone 304) but lacks an ability to limit the audio output of at least one other source, such as ambient noise source 306. Processor 308 may be embodied in a dedicated computing device or shared computing device, such as within phone 204, headset 208, computer 302, phone 304 (not shown) or server 224 or other device and/or a combination thereof where audio level data may be received from devices and/or a plurality of processor 308 may intercommunicate their respective revived audio level data. Accordingly, if the audio exposure provided to user 202 is above a threshold audio level (see, FIGS. 1A-1B), as provided by the subset of sound producing components and ambient noise source 306, processor 308 may cause the audio output of the sound producing component to be reduced, trigger an alert to the user and/or a supervisor (e.g., computer executable process, device for the alert messages to a human, etc.), and/or other action such as to track the sound exposure of user 202 and/or take corrective action. Should processor 308 be unable to reduce the sound output of the subset of sound producing components to a sufficient level, to cause user 202 exposure fall below the threshold audio level for a subsequent period of time and/or remain at a level to enable user 202 to remain productive (e.g., still able to perform necessary operations such as to communicate with customer 220), the supervisor may reassign user 202 to another task. For example, server 224 may comprise processor 308 that determines that user 202 has reached a threshold audio level. Processor 308 may then route calls, such as between subsequent audio calls with one or more customer 220 to other users who have not reached their respective threshold audio level. For example, system 300 may be a contact center, such as providing a plurality of communication types (e.g., voice, video with voice, text, social media, etc.). The contact center may utilize certain essential and non-essential devices that comprise ambient noise source 306. For example, user 202 may be proximate to other users whose conversations may be heard by user 202. Air conditioning, printers, equipment and equipment components (e.g., fans, speakers, etc.) may each comprise a portion of ambient noise source 306 which are required for the operation of the contact center. Accordingly, merely discontinuing or reducing ambient noise source 306 may not an option available to reduce the audio level presented to user 202.

User 202, upon reaching a threshold audio level, may be provided with work items that exclude an audio portion, such as by being assigned work items utilizing text (e.g., short message service (SMS) messages, email, social media, etc.). In other embodiments, the supervisor may, upon receiving an alert indicating user 202 has exceeded a threshold audio level, cause user 202 to be reassigned to other work, be relocated to another work location, trigger a work-break, terminate the work shift, or other action to cause user 202 to be exposed to a reduced sound level over a future period of time.

Processor 308 may be configured to receive sound waves, however, in other embodiments, processor 308 receives sound data via communication from another component. Sound data may comprise analog voltages, associated with sound amplitude, digitization of analog sound data, digital packets of encoded sound data comprising volume, and/or other sound data conveying record operable to be processed by processor 308. Processor 308 may utilize proxy sound data having a known association with a sound level. For example, ambient noise 306 may be provided by a machine operating at a certain capacity or performing a particular operation and have a known association with a particular sound level. As a result, processor 308 may obtain an operating parameter of the machine as a proxy sound data. Audio data may further be obtained by a microphone configured to receive sound from one or more audio sources. For example, a dedicated or shared microphone (e.g., headset 208 microphone, phone 204 microphone, etc.) may be utilized to obtain audio data from one or more sources, such as when audio data cannot be measured by the source. Processor 308 may apply modification to the audio data and/or proxy audio data to better reflect the sound energy presented to the ear(s) of user 202. For example, one user 202 may be a first distance from a machine operating at known capacity while another user is a farther, second distance from the machine. Accordingly, processor 308 may modify the audio data to reflect the greater volume experienced by the user 202 at the first distance and/or lesser volume experience by the user 202 located farther away.

Processor 308 may be configured to directly alter the audio output of the subset of sound producing components, whereby, upon determining user 202 has reached a threshold audio level, processor 308 provides an audio limiting signal to a device. In response, the device reduces the audio output. In another embodiment, processor 308, in response to user 202 having reached the threshold audio level, writes a record (e.g., sets a memory/register value, writes/updates a database record, writes/updates a media entry, outputs a message, etc.). A device, upon reading the record, such as via network 216, then executes the audio limiting action. For example, user 202 may have used headset 208 for a period of time and at a volume to have reached the threshold audio level as determined by processor 208. Processor 208 may then write a record to a computer data storage, such as a database (e.g., database 222), indicating the need for the audio limitation action, such as by computer 302. Computer 302 may then be accessed by user 202, such as to play music, video with audio, teleconference with audio etc. Computer 302, upon reading the record, limits the audio output by computer 302.

Figure 4A:
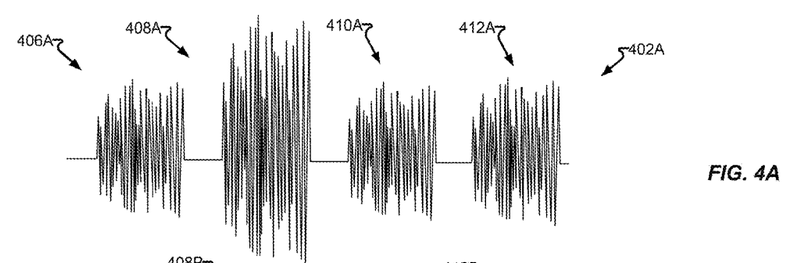
FIGS. 4A-4C depicts waveforms in accordance with embodiments of the present disclosure.
Figure 4B:
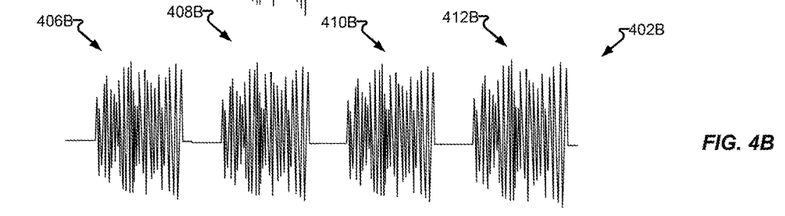
Figure 4C:
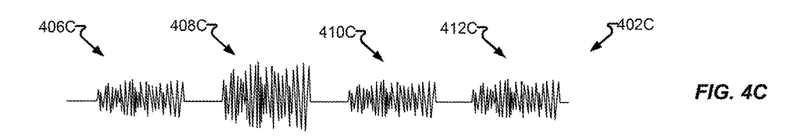

FIGS. 4A-4C depicts waveforms 402 in accordance with embodiments of the present disclosure. In one embodiment, waveform 402A comprises a portion of an unmodified audio signal. Waveform 402A comprises portions 406A, 408A, 410A, and 412A as measured over a period of time. In one embodiment, one or more of portions 406A, 408A, 410A, and 412A represent long-term audio signal data. In another embodiment, one or more of portions 406A, 408A, 410A, and 412A represent at least one out of audio signal data. In another embodiment, the combination of portions 406A, 408A, 410A, and 412A represent audio signal data for a work shift. In another embodiment, the combination of portions 406A, 408A, 410A, and 412A represent at least four hours audio signal data for a work shift. In another embodiment, the combination of portions 406A, 408A, 410A, and 412A represent more than five and less than fourteen hours audio signal data for a work shift. In another embodiment, the combination of portions 406A, 408A, 410A, and 412A represent more than five and less than ten hours audio signal data for a work shift.

Waveform 402A comprises portions 406A, 410A, and 412A comprising no audio levels high enough to warrant an audio limiting action. Portion 408A is over a threshold audio level if presented to user 202, such as via headset 208.

Processor 308 may execute an audio limiting action such as to convert waveform 402A into waveform 402B, whereby waveform 402B may be presented to user 202 without exceeded the threshold audio level. Waveform 402B comprises portions 406B, 408B, 410B, and 412B. Waveform 402B portions 406B, 410B, and 412B are unmodified (e.g., no audio limiting action has been applied) to corresponding portions 406A, 410A, and 412A of waveform 402A. As a result, waveform 402B is modified only to an extent necessary to restrict waveform 402B to not cause any portion to be over the threshold audio level. In another embodiment, waveform 402C comprises portions 406C, 408C, 410C, and 412C which is a dampened waveform 402A. As a result, waveform 402 comprises portions 406C, 408C, 410C, and 412C corresponding to portions 406A, 408A, 410A, and 412A of waveform 402A, which each portion dampened proportionally to the level required to bring portion 408A down to portion 408C.

Figure 5:
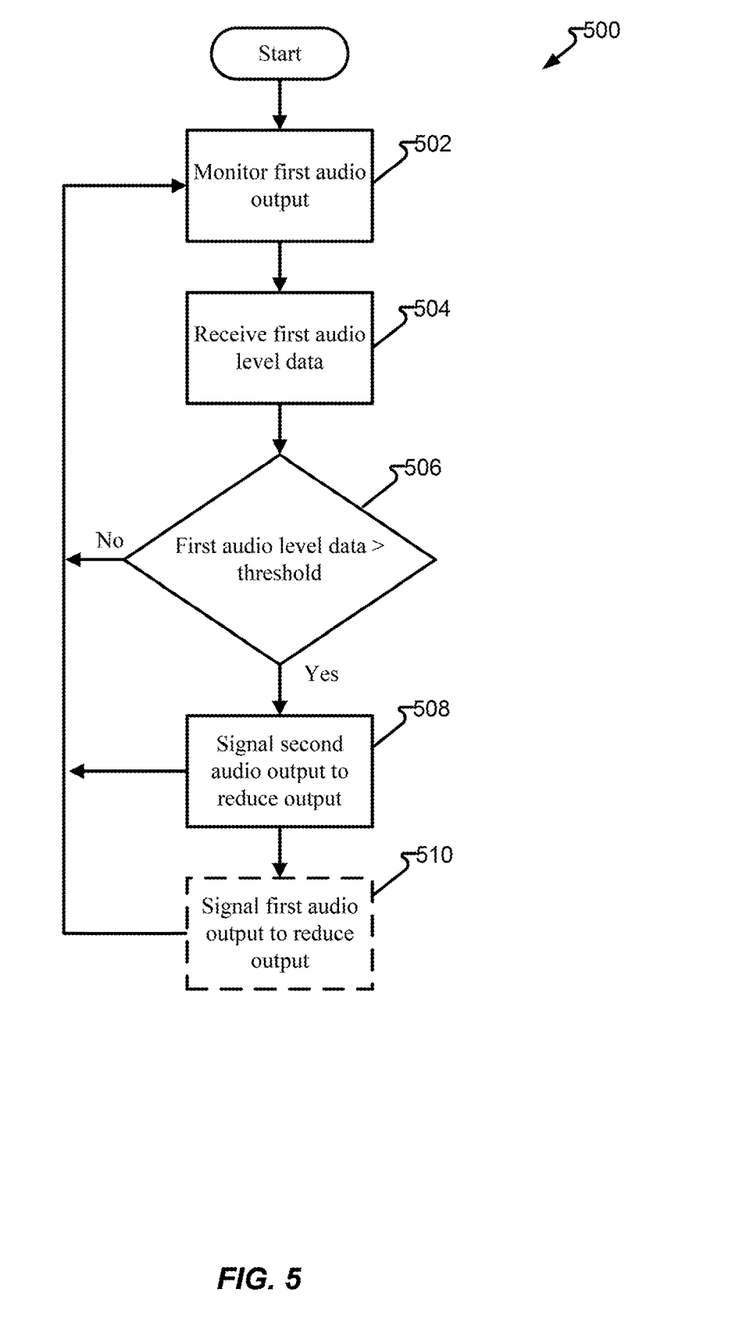
FIG. 5 depicts a process in accordance with embodiments of the present disclosure.

FIG. 5 depicts process 500 in accordance with embodiments of the present disclosure. In one embodiment, process 500 is executed by processor 308 as embodied in one or more shared devices (e.g., headset 208, phone 204, computer 302, cellular telephone 304, etc.) and/or computing devices (e.g., server 308, plurality of servers 308, computer 302, plurality of processors 308, etc.). Process 500 begins and, at step 502, monitors a first audio output. Step 502 may comprise direct measurement (e.g., microphone or other sound level measuring providing sound level data) or indirect measurement (e.g., an operation of a machine having a known associated audio output, voltage on a wire producing an audio wave, etc.).

Step 504 receives first audio level data and tested in step 506 whether the first audio level data is greater than, or equal to or greater than, a threshold audio level. Step 506 may determine if a user has been exposed to excessive levels of sound for a period of time, such as by determining if the first audio level data is above any one or more thresholds provided with respect to FIGS. 1A-1B. In another embodiment, step 506 may determine if the audio level data will become over the threshold audio level within a period of time. For example, if a user, such as user 202, has one hour of their work shift remaining and their audio level data indicates a trend such that they will be over the threshold audio level in two hours, step 506 may be answered in the negative. However, if the shift has two hours remaining, but will be exposed to audio level data greater than the threshold audio level data within the next hour, an audio limiting action may be taken in anticipation of an excessive exposure, such as to allow time for alternative work assignments to be made. Accordingly, step 506 may be answered in the affirmative. If step 506 is determined in the affirmative, process 500 may continue to step 508. If step 506 is determined in the negative, process 500 may continue back to step 502.

Step 508 causes a second audio output to reduce output, in response to step 506 being determined in the affirmative. Optionally, step 510 may be executed such as when processor 308 has a capacity to cause a first device, producing the first audio output, to execute the audio limiting action.

In another embodiment, step 502 may further comprise monitoring the first and the second audio devices producing a first audio level data and a second audio level data to be received at step 504. Step 506 then determines if the combination of the first audio data and the second audio data is over the threshold audio level and, if yes, execute step 508 and optionally step 510 when the first audio device producing the first audio output may be limited by a signal.

While decreasing the volume of a volume-controlled device is one audio limiting action, in other embodiments, additional or alternative audio limiting actions may be utilized. For example, a machine configured to receiving a signal associated with the audio limiting action may powered-down or operate in a different mode to cause the machine to reduce audio output, a speaker may be caused to shift output to a different range of frequencies, a user may be reassigned to a quieter location, a user may be required to utilize or not utilize a particular device (e.g., mandate the use of noise-cancelling headphones, disable the use of ambient-transparent earbuds, etc.). In another embodiment, the audio limiting action may alter a previously limit. For example, headset 208 may be configured to never produce a sound greater than 120 dB. In response to an audio limiting action, headset 208 may be reconfigured to never produce a sound greater than 100 dB.

In the foregoing description, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor (e.g., GPU, CPU), or logic circuits programmed with the instructions to perform the methods (e.g., FPGA). In another embodiment, a processor may be a system or collection of processing components, such as a processor on a client device and a processor on a server, a collection of devices with their own respective processor, or a shared or remote processing service (e.g., "cloud" based processor). A system of processors may comprise task-specific allocation of processing tasks and/or shared or distributed processing tasks.

These machine-executable instructions may be stored on one or more machine-readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

While machine-executable instructions may be stored and executed locally to a particular machine (e.g., personal computer, mobile computing device, laptop, etc.), it should be appreciated that the storage of data and/or instructions and/or the execution of at least a portion of the instructions may be provided via connectivity to a remote data storage and/or processing device or collection of devices, commonly known as "the cloud," but may include a public, private, dedicated, shared and/or other service bureau, computing service, and/or "server farm."

Examples of the processors as described herein may include, but are not limited to, at least one of Qualcomm® Snapdragon® 800 and 801, Qualcomm® Snapdragon® 610 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22 nm Haswell, Intel® Core® i5-3570K 22 nm Ivy Bridge, the AMD® FX™ family of processors, AMD® FX-4300, FX-6300, and FX-8350 32 nm Vishera, AMD® Kaveri processors, Texas Instruments® Jacinto C6000™ automotive infotainment processors, Texas Instruments® OMAP™ automotive-grade mobile processors, ARM® Cortex™-M processors, ARM® Cortex-A and ARM926EJ-S™ processors, other industry-equivalent processors, and may perform computational functions using any known or future-developed standard, instruction set, libraries, and/or architecture.

Any of the steps, functions, and operations discussed herein can be performed continuously and automatically.

The exemplary systems and methods of this invention have been described in relation to communications systems and components and methods for monitoring, enhancing, and embellishing communications and messages. However, to avoid unnecessarily obscuring the present invention, the preceding description omits a number of known structures and devices. This omission is not to be construed as a limitation of the scope of the claimed invention. Specific details are set forth to provide an understanding of the present invention. It should, however, be appreciated that the present invention may be practiced in a variety of ways beyond the specific detail set forth herein.

Furthermore, while the exemplary embodiments illustrated herein show the various components of the system collocated, certain components of the system can be located remotely, at distant portions of a distributed network, such as a LAN and/or the Internet, or within a dedicated system. Thus, it should be appreciated, that the components or portions thereof (e.g., processors, memory/storage, interfaces, etc.) of the system can be combined into one or more devices, such as a server, servers, computer, computing device, terminal, "cloud" or other distributed processing, or collocated on a particular node of a distributed network, such as an analog and/or digital telecommunications network, a packet-switched network, or a circuit-switched network. In another embodiment, the components may be physical or logically distributed across a plurality of components (e.g., a processor may comprise a first processor on one component and a second processor on another component, each performing a portion of a shared task and/or an allocated task). It will be appreciated from the preceding description, and for reasons of computational efficiency, that the components of the system can be arranged at any location within a distributed network of components without affecting the operation of the system. For example, the various components can be located in a switch such as a PBX and media server, gateway, in one or more communications devices, at one or more users' premises, or some combination thereof. Similarly, one or more functional portions of the system could be distributed between a telecommunications device(s) and an associated computing device.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire, and fiber optics, and may take the form of acoustic or light waves, such as those generated during radio-wave and infra-red data communications.

Also, while the flowcharts have been discussed and illustrated in relation to a particular sequence of events, it should be appreciated that changes, additions, and omissions to this sequence can occur without materially affecting the operation of the invention.

In yet another embodiment, the systems and methods of this invention can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this invention. Exemplary hardware that can be used for the present invention includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this invention is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this invention can be implemented as a program embedded on a personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present invention describes components and functions implemented in the embodiments with reference to particular standards and protocols, the invention is not limited to such standards and protocols. Other similar standards and protocols not mentioned herein are in existence and are considered to be included in the present invention. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present invention.

The present invention, in various embodiments, configurations, and aspects, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and\or reducing cost of implementation.

The foregoing discussion of the invention has been presented for purposes of illustration and description. The foregoing is not intended to limit the invention to the form or forms disclosed herein. In the foregoing Detailed Description for example, various features of the invention are grouped together in one or more embodiments, configurations, or aspects for the purpose of streamlining the disclosure. The features of the embodiments, configurations, or aspects of the invention may be combined in alternate embodiments, configurations, or aspects other than those discussed above. This method of disclosure is not to be interpreted as reflecting an intention that the claimed invention requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the invention.

Moreover, though the description of the invention has included description of one or more embodiments, configurations, or aspects and certain variations and modifications, other variations, combinations, and modifications are within the scope of the invention, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

What is claimed is:

1. A system, comprising:
    a processor to input, process, and output electrical signals;
    a second audio output for outputting sound at a level controllable, at least in part, by the processor;
    wherein, the processor, upon receiving a first audio level data observed as sound energy produced by a first audio output, determines whether the first audio level data is above a threshold audio level data;
    wherein, the processor, upon determining that the first audio level data is above the threshold audio level data, executes an audio limiting action to cause the second audio output to operate at a reduced level audio output level; and
    wherein the processor upon determining that the first audio level data is not above the threshold audio level data, executes the audio limiting action to cause the second audio output to operate at the reduced level audio output level to cause the second audio output to omit execution of the audio limiting action.

2. The system of claim 1, wherein the processor receives the first audio level data from the first audio output and further comprising:
    a network interface; and
    a computer data storage accessible to the processor via the network interface; and
    wherein the processor executes the audio limiting action, further comprising providing a value to the computer data storage that, when read by the second audio output, causes the second audio output to execute the audio limiting action.

3. The system of claim 1, wherein the processor receives the first audio level data from the first audio output and wherein:
    the processor is further configured to receive a second audio level data from the second audio output;
    the processor further determines whether the first audio level data, when combined with the second audio data, is above a threshold audio level data; and
    the processor, upon determining the first audio level data, when combined with the second audio data, is above the threshold audio level data, executes the audio limiting action.

4. The system of claim 3, wherein the audio limiting action is selected in accordance with a sound exposure, as determined by at least one of the first audio level data or the second audio level data, for a future period of time that would causes the at least one of the first audio output data or the second audio output data, that was determined to be above the threshold audio level, to be below the threshold audio level data in the future period of time.

5. The system of claim 3, wherein, at least one of the first audio data or the second audio data is a proxy audio data obtained by observing a data value having a known association to the sound output provided by the at least one of the first audio output or the second audio output.

6. The system of claim 1, wherein the processor receives the first audio level data from the first audio output and wherein, the first audio data is obtained by a microphone connected to the processor and receiving an audio output from the first audio output.

7. The system of claim 6, wherein the audio output comprises an ambient noise.

8. The system of claim 1, wherein the processor receives the first audio level data from a first audio output and further comprising:
    a network interface; and
    wherein, the audio limiting action further comprises the processor transmitting, via the network interface, an alert signal to an alert-receiving component.

9. A system, comprising:
    a processor to input, process, and output electrical signals;
    one or more of a first audio input and output for providing sound at a level controllable, at least in part, by the processor;
    a second audio output for outputting sound at a level controllable, at least in part, by the processor;
    wherein, the processor, upon receiving a first audio level data from the one or more of the first audio input and output and a second audio level data from the second audio output, determines whether the combination of the first audio level data and the second audio level data is above a threshold audio level data;
    wherein, the processor, upon determining that the combination is above the threshold audio level data, executes an audio limiting action to cause at least one of the one or more of the first audio input and output or the second audio output to operate at a reduced audio output level; and
    wherein the processor upon determining that the first audio level data is not above the threshold audio level data, executes the audio limiting action to cause the second audio output to operate at the reduced level audio output level to cause the second audio output to omit execution of the audio limiting action.

10. The system of claim 9, wherein the one or more of a first audio input and output is the first audio output and further comprising:
    a network interface; and
    a computer data storage accessible to the processor via the network interface; and
    wherein the processor executes the audio limiting action, further comprising providing a value to the computer data storage that, when read by at least one of the first audio output or the second audio output, causes the at least one of the first audio output or the second audio output to execute the audio limiting action.

11. The system of claim 9, wherein the one or more of a first audio input and output is the first audio input and wherein the audio limiting action is selected in accordance with a sound exposure, as determined by at least one of the first audio level data or the second audio level data, for a future period of time that would causes the at least one of the first audio level data or the second audio level data to be below the threshold audio level data, previously above the threshold audio level, to be below the threshold audio level over the future period of time.

12. The system of claim 9, wherein the one or more of a first audio input and output is the first audio output and wherein, at least one of the first audio data or the second audio data is a proxy audio data obtained by observing a data value having a known association to the sound output provided by the at least one of the first audio output or the second audio output.

13. The system of claim 12, wherein the data value comprises an encoded audio signal utilized as an input to the at least one of the first audio output or the second audio output.

14. The system of claim 9, wherein the one or more of a first audio input and output is the first audio input and wherein, at least one of the first audio data or the second audio data is obtained by a microphone connected to the processor and receiving an audio output from a corresponding at least one of the one or more of a first audio input and output or second audio output.

15. The system of claim 9, wherein:
the processor receives the first audio level data from the first audio output and wherein, the first audio data is obtained by a microphone connected to the processor and receiving an audio output from the first audio output; and
wherein the audio output comprises an ambient noise.

16. A method, comprising:
receiving, at a processor configured to input, process, and output electrical signals, a first audio level data observed as sound energy produced by a first audio output;
accessing, by the processor via a network interface, a threshold audio level data;
determining, by the processor, whether the first audio level data is above the threshold audio level data; and
upon determining that the first audio level data is above the threshold audio level data, executing, by the processor, an audio limiting action to cause a second audio output to operate at a reduced audio output level; and
upon determining that the first audio level data is not above the threshold audio level data, executing, by the processor, the audio limiting action to cause the second audio output to operate at the reduced level audio output level to cause the second audio output to omit execution of the audio limiting action.

17. The method of claim 16, wherein the processor receives the first audio level data from the first audio output and further comprising:
receiving, by the processor, a second audio level data from the second audio output;
wherein, the determining of whether the first audio level data is above the threshold audio level, further comprises, determining whether the first audio level data, when combined with the second audio data, is above a threshold audio level data; and
wherein, the upon determining the first audio level data, when combined with the second audio data, is above the threshold audio level data, executing the audio limiting action.

18. The method of claim 17, further comprising:
selecting, by the processor, the audio limiting action in accordance with a sound exposure, as determined by at least one of the first audio level data or the second audio level data, for a future period of time that would causes the at least one of the first audio output data or the second audio output data, that was determined to be above the threshold audio level, to be below the threshold audio level data in the future period of time.

19. The method of claim 17, wherein, at least one of the first audio data or the second audio data is a proxy audio data obtained by observing a data value having a known association to the sound output provided by the at least one of the first audio output or the second audio output.

20. The method of claim 16, wherein the processor receives the first audio level data from the first audio input and wherein the processor executes the audio limiting action, further comprising providing a value, via the network interface, to the computer data storage that, when read by the second audio output, causes the second audio output to execute the audio limiting action.

* * * * *